United States Patent
Frosien et al.

(10) Patent No.: US 7,589,328 B2
(45) Date of Patent: Sep. 15, 2009

(54) GAS FIELD ION SOURCE FOR MULTIPLE APPLICATIONS

(75) Inventors: Juergen Frosien, Riemerling (DE); Dieter Winkler, Munich (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 167 days.

(21) Appl. No.: 11/925,609

(22) Filed: Oct. 26, 2007

(65) Prior Publication Data

US 2008/0142702 A1 Jun. 19, 2008

(30) Foreign Application Priority Data

Dec. 18, 2006 (EP) .................................. 06026210

(51) Int. Cl.
- H01J 49/10 (2006.01)
- H01J 27/02 (2006.01)
- H01J 27/26 (2006.01)

(52) U.S. Cl. .............................. 250/423 F; 250/423 R; 250/424; 250/426; 250/492.21; 250/492.2

(58) Field of Classification Search .............. 250/423 F, 250/423 R, 424, 426, 492.21, 492.2
See application file for complete search history.

(56) References Cited

U.S. PATENT DOCUMENTS

| 6,733,590 B1 | 5/2004 | McLeod et al. |
| 2002/0117637 A1 | 8/2002 | Donaldson et al. |
| 2007/0228287 A1* | 10/2007 | Ward et al. .................. 250/424 |
| 2008/0217555 A1* | 9/2008 | Ward et al. ............... 250/423 F |
| 2009/0020708 A1* | 1/2009 | Winkler et al. .............. 250/424 |
| 2009/0057566 A1* | 3/2009 | Winkler et al. ........... 250/423 F |

FOREIGN PATENT DOCUMENTS

| JP | 11086772 | 3/1999 |
| JP | 2001035401 | 2/2001 |

OTHER PUBLICATIONS

European Search Report dated Jan. 8, 2009, Application No. EP 08167462.4.
Extended European Search Report dated Oct. 19, 2007.

* cited by examiner

Primary Examiner—Nikita Wells
(74) Attorney, Agent, or Firm—Patterson & Sheridan, LLP

(57) ABSTRACT

A focused ion beam device is described. The device includes an ion beam column including an enclosure for housing an emitter with an emitter area for generating ions, a first gas inlet adapted to introduce a first gas to the emitter area, a second gas inlet adapted to introduce a second gas different from the first gas to the emitter area, and a switching unit adapted to switch between introducing the first gas and introducing the second gas.

30 Claims, 5 Drawing Sheets

GAS FIELD ION SOURCE FOR MULTIPLE APPLICATIONS

FIELD OF THE INVENTION

The invention relates to a charged particle beam device and a method of operating a charged particle beam device. Particularly, it relates to a charged particle beam device for irradiating, in particular inspecting and structuring a specimen. Further, it relates to a gas field ion source for multiple applications. More specifically, it relates to a focused ion beam device and a method of operating a focused ion beam device.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wave lengths at comparable particle energy.

During manufacturing of semiconductor devices or the like, a plurality of observation steps and sample modification steps are usually conducted. Common systems include an electron beam column for observation, imaging, testing or inspecting of a specimen and an ion beam column for patterning of a specimen or material modification. These "dual beam" systems have a high complexity and are, thus, expensive.

SUMMARY

In light of the above, the present invention provides a focused ion beam device according to independent claims 1 and 17 and a method of operating a focused ion beam device according to independent claim 20.

According to one embodiment, a focused ion beam device is provided. The focused ion beam includes an ion beam column including an enclosure for housing an emitter with an emitter area for generating ions, a first gas inlet adapted to introduce a first gas to the emitter area, a second gas inlet adapted to introduce a second gas different from the first gas to the emitter area, and a switching unit adapted to switch between introducing the first gas and introducing the second gas.

Further advantages, features, aspects and details that can be combined with the above embodiments are evident from the dependent claims, the description and the drawings.

According to another embodiment, a focused ion beam device is provided. The focused ion beam device includes an ion beam column including an enclosure for housing an emitter with an emitter area for generating ions, means for switching between introducing a light gas into the emitter area for an observation mode and introducing a heavy gas into the emitter area for a modification mode, wherein the light gas is selected from the group consisting of hydrogen and helium and the heavy gas has an atomic mass of 10 g/mol or higher.

According to another embodiment, a method of operating a focused ion beam device is provided. The method includes biasing an emitter within an emitter area wherein ions are generated, switching between introducing a light gas to the emitter area and a heavy gas to the emitter area, wherein the light gas is selected from the group consisting of hydrogen and helium and the heavy gas has an atomic mass of 10 g/mol or higher.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates It includes method steps for carrying out every function of the apparatus.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE INVENTION

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited or which are structured. A specimen includes a surface to be structured or on which layers are deposited, an edge, and typically a bevel.

According to embodiments described herein, a single column charged particle beam device is provided which allows for a high resolution imaging and sample modification. Thereby, in light of the fact that one column can be omitted, the reduction of costs can be achieved. Further, an automatic alignment between the point of incidence of the observation beam and the mortification beam can be realized more easily.

Figure 1A:
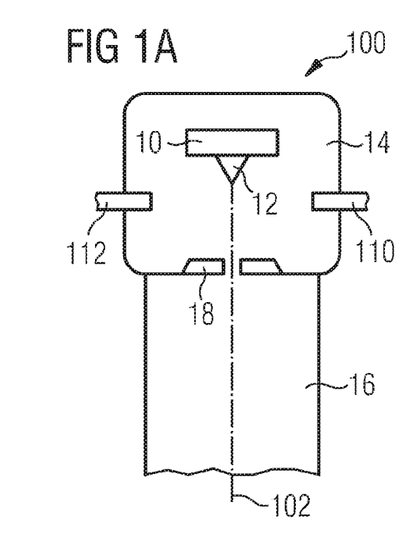
FIG. 1*a* shows a schematic view of parts of a charged particle beam device in the form of a focused ion beam device with a first gas inlet and a second gas inlet according to embodiments described herein.

One embodiment of a charged particle beam device in the form of a focused ion beam device 100, as illustrated in FIG. 1a, includes a gun chamber 14. Therein, a gas field ion source emitter 12 mounted to a holder 10 is provided. An ion beam emitted along axis 102 enters the ion beam column 16 through aperture 18.

Generally, focused ion beam devices can, for example, be based on liquid-metal ion sources or gas ion sources. Gas ions can be produced by bombardment of electrons, atoms or ions with gas atoms or molecules or by exposing gas atoms or molecules to high electric fields or irradiation. Thereby, noble gas ion sources have been found to be potential candidates for focused ion beam FIB applications. Sources based on the field ionization process are known as gas field ion sources (GFIS). An ionization process takes place at high electric fields larger $10^{10}$ V/m. The field may, for example, be applied between an emitter tip and a biased extraction aperture.

The emitter tip is biased to a, e.g., 10 kV positive potential with respect to a downstream extraction aperture that produces an electric field strong enough to ionize the gas atoms in the vicinity of the emitter tip. The area in the vicinity of the emitter, wherein the desired electric field is provided or more generally, wherein the generation of ions is conducted, may be referred to as emitter area. Gas pressures of $10^{-6}$ mbar, $10^{-2}$ mbar are desirable near the emitter unit tip. In view of potential contamination of the entire focused ion beam column with the gas molecules, according to some embodiments described herein, an enclosure or a separate chamber is provided to locally provide the gas for the gas ion source locally in the area of the emitter.

Within FIG. 1a, a first gas inlet 110 and a second gas inlet 112 are provided. According to one operational mode, a light gas, such as hydrogen or helium is introduced into the chamber/enclosure 14 through the first gas inlet 110 and an ion beam of the ionized light gas is generate. The light gas ions can be used for an observation or imaging without damaging the specimen.

According to another operational mode, a different gas, which is a heavier gas as, for example, argon, neon, xenon or krypton is introduced into the chamber through the second gas inlet 120. The ion beam of the ionized heavy gas, which is generated within the gun chamber/enclosure 14, is similar to an ion beam of a standard focused ion beam column for sputtering material. The heavy ion gas beam can, thus, be used for material modification or to produce cuts or trenches within the specimen or to get depth information.

Within the embodiments described herein, the enclosure 14, in which the emitter 12 is provided, may be a part of the ion beam column 16. Alternatively, it may be a chamber included in the ion beam column. Further, it is possible that the ion beam column itself provides the enclosure, wherein the emitter is located and wherein the gases are introduced.

The light gas ions do not sputter the sample material, and can be used for imaging, testing, observation or the like. Thereby, a light gas ion may have an even better resolution than an electron beam because of the shorter wavelengths of the ion beam as compared to an electron beam.

Figure 1B:
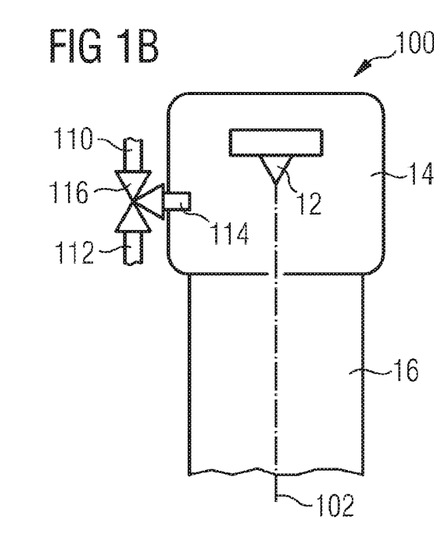
FIG. 1*b* shows a schematic view of parts of a charged particle beam device in the form of a focused ion beam device with a first gas inlet, a second gas inlet, and a common gas inlet according to embodiments described herein.

According to another embodiment, which is illustrated with respect FIG. 1b, the first gas inlet 110 and that the second gas inlet 112 are connected to a common gas inlet 114. According to one and embodiment, the first gas inlet and the second gas inlet are connected to the common gas inlet via valve 116. For the embodiments, for which a common gas inlet 114 is used, care has to be taking that the space, which has to be emptied or purged in order to switch between a light gas and a heavy gas, is minimized. Therefore, the common gas inlet 114 is typically short and has a small diameter. Further, for embodiments including valve 116, the valve is typically positioned close to the opening of the common gas inlet. According to one embodiment, the valve 116 may be a micro-valve.

Figure 2:
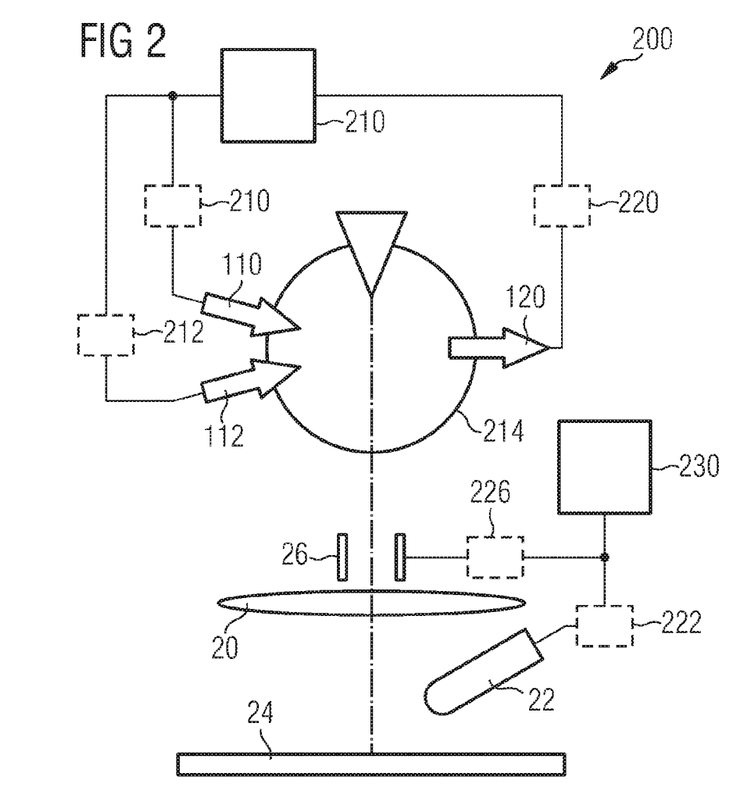
FIG. 2 shows a schematic view of a charged particle beam device including controllers for controlling an observation mode and for controlling a switching between a light and a heavy gas according to embodiments described herein.

Generally, as shown in FIG. 2, a focused ion beam device 200 can schematically be described as follows. An enclosure 214 with a biased gas field ion source emitter tip 12 is provided. Further, a first (light) gas inlet 110 and a second (heavy) gas inlet 112 is provided. Thereby, the first gas and the second gas are provided into the enclosure 214 towards the emitter 12 and to the emitter area in the vicinity of the emitter, wherein the desired excitation conditions are provided. According to one embodiment, the two gas inlets are provided in the form of two nozzles, gas channels, or other independent gas inlet means. According to another embodiment, the two gas inlets provide the two gases into a common nozzle, gas channel, or other gas inlet means.

As shown in FIG. 2, a gas outlet 120 is provided. The gas outlet 120 can be connected to a vacuum pump, a further vacuum chamber, or other means to support the evacuation of one of the two gases in order to switch between the at least two operational modes. The gas outlet 120 and a vacuum system connected therewith may also be used to control the vacuum conditions within the enclosure 214. Thereby, the process parameters for ion generation can be controlled.

Within FIG. 2, a switching unit 210 in the form of a controller or the like is shown. Controller 210 controls the switching between the supply of light gas into the enclosure 214 and the supply of heavy gas into the enclosure 214. Further, for embodiments including a separate gas outlet 120, the controller may control the gas outlet, vacuum system, vacuum pumps, or valves corresponding therewith. According to further embodiments, controllers 210, 211, 212, and 220 are provided. These controllers are controllers for the individual inlets, outlets, valves, pumps and the like. As indicated by the dashed lines, these controllers may be omitted as they are redundant in the case the controller 210 is able to control the components directly. According to further embodiments described herein, the switching unit can include at least one component of the group consisting of: a controller, controllers, a valve, valves, vacuum generating components (like pumps, valves and recipients), and combinations thereof.

The ion beam is focused by the lens 20 on the specimen 24. According to one embodiment, lens 20 is an electrostatic lens. According to other embodiments, lens 20 may be a magnetic lens or a compound magnetic-electrostatic lens. Depending on the application, one or more optical devices such as electrostatic lenses, magnetic lenses, compound magnetic-electrostatic lenses, Wien filters, condensers, aligners, collimators, deflectors, accelerators, decelerators, apertures etc. could additionally be arranged in the focused ion beam device.

Generally, the ion beam is deflected with a scan deflector 26 to raster scan the ion beam over the specimen 24 or position the ion beam at the position of the specimen. Secondary or backscatter particles, for example secondary electrons are detected with detector 22, particularly when the single column focused ion beam device is operated in an observation mode.

Within FIG. 2, controller 230 is shown. Controller 230 controls the scan deflector 26 and the detector 22. During the observation mode of the focused ion beam column 200, the device works similar to an electron microscope. The ion beam with a diameter of a few nanometers or less (e.g., 1 nm or less) is raster scanned in a pattern over specimen 24. Secondary electrons or other corpuscles can be detected with the detector. A time resolved signal is generated and the controller 230 allows for correlating a signal at a given instance of time with a corresponding deflection value. Thereby, the raster pattern can be assembled to an image by correlating the signals with the positions. A typical time resolution (time interval between two subsequent (quasi-continuous measurement points or pixels) is between 500 ns and 500 µs. The time per pixel may according to other embodiments be 10 µs, 1 µs or less.

Figure 3:
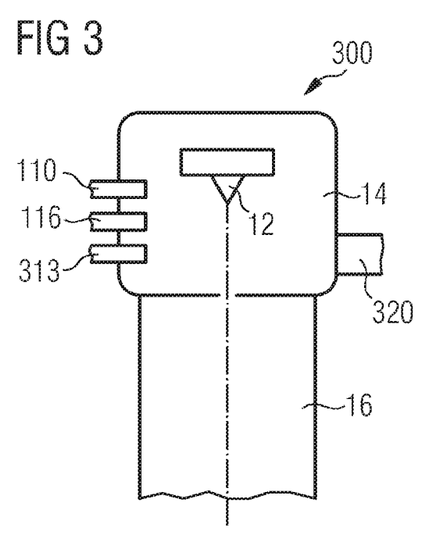
FIG. 3 shows a schematic view of parts of a charged particle beam device in the form of a focused ion beam device with a first gas inlet, a second gas inlet and a third gas inlet according to embodiments described herein.

Within FIG. 3, a charged particle beam device 300 is shown. The charged particle beam device includes an emitter 12, an enclosure/gun chamber 14, and an ion beam column 16. Ions of gases, which are present in the enclosure 14, are generated by the high electric field of the biased emitter 12.

According to one embodiment, a first gas inlet 110, a second gas inlet 112, and a third gas inlet 313 of provided. Thereby, switching between three types of ion beams is possible. For example, a light gas like a hydrogen or helium may be introduced through the first gas inlet 110 in the enclosure 14 for observation of a specimen without damaging the specimen. For a different mode of operation, a second gas like argon, neon, xenon or krypton may be introduced through the second gas inlet 112 in the enclosure 14 for sputtering of a specimen.

According to further embodiments, hydrogen may be used with regard to the even further mode of operation in the event materials like a photo resist are etched. The reducing property of hydrogen may be used for an etching of oxygen-containing materials. Nevertheless, hydrogen may be used in an imaging mode for a plurality of materials, like Si, metals, and the like.

According to an even further embodiment, a fourth gas inlet could be provided. Thereby, a fourth mode of operation can be conducted by introducing a conditioning gas, e.g., oxygen in the enclosure around the emitter tip. According to this embodiment, oxygen can be used for conditioning the tip. This further conditioning mode of operation, wherein the tip of the emitter is shaped or re-shaped, may be supported by the introduction of oxygen.

Generally, within the embodiments described herein, at least two different ion beam generating gases can be introduced in the enclosure. According to embodiments described herein, the at least two different ion beam generating gases are sequentially introduced in the enclosure. Thereby, as explained above, a light gas and a heavy gas is used. According to further embodiments, at least one further ion generating gas is introduced in the enclosure. Thereby, an ion generating gas for etching or an ion generating gas for a second sputtering option (e.g., first sputter option with argon and second sputter option with neon or xenon) can be introduced. According to these embodiments, at least a third gas inlet is provided. In the event more than one ion beam generating gas for sputtering or more than one ion beam generating gas for etching is used, also a fourth, fifth, etc gas inlet can be provided.

Yet according to further embodiments, processing gases in the form of the above mentioned emitter tip conditioning gas (oxygen), carrier gases, purge gases, or the like may be introduced. Processing gases are to be understood as gases, which are not used for ion beam generating, but for process support instead.

According to another embodiment, which is described with respect to FIG. 3, additionally a gas outlet 320 can be provided. The gas outlet 320 may be connected to a vacuum system including a vacuum pump and/or a vacuum recipient. An evacuation of the enclosure 14 can be used to control the pressure in the enclosure and, thereby, control a process parameter for the ion generation. Typically, a partial pressure of the gas to be ionized is controlled to be in the range of $10^{-6}$ to $10^{-2}$ mbar in the area of the emitter. According to another embodiment, the evacuation of the enclosure 14 can be used during a switching between a first operational mode and a further (second or third) operational mode. Thus, a gas used for the first operational mode can be removed faster from the area of ion generation. As a consequence, a switching between one mode of operation and another mode of operation can be conducted faster, for example, in 5 s or less.

Figure 4A:
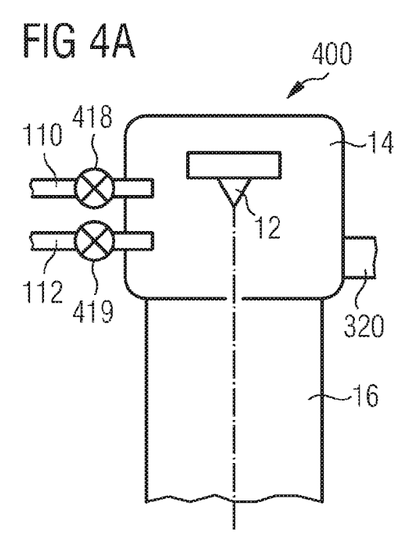
FIG. 4*a* shows a schematic view of parts of a charged particle beam device in the form of a focused ion beam device with gas inlets and valves according to embodiments described herein.

Within FIG. 4a, a charged particle beam device 400 is shown. The charged particle beam device includes an emitter 12, an enclosure/gun chamber 14, and an ion beam column 16. Ions of gases, which are present in the enclosure 14, are generated by the high electric field of the biased emitter 12.

According to one embodiment, a first gas inlet 110 and a second gas inlet 112 are provided. Additionally, valve 418 is provided within the first gas inlet 110. Further, valve 419 is provided within the second gas inlet 112. The valves are controlled by a controller adapted for switching between introducing the first gas in the enclosure 14 and introducing the second gas in the enclosure.

According to one embodiment, valves 418 and 419 are positioned close to the outlet opening of the gas inlets. Thereby, the amount of gas remaining from a previous operational mode, which has to be removed for a second or third operational mode, is reduced. When one of the valves is closed, the volume, in which the gas of the previous operational mode is still present, is minimized if the valve is positioned close to the outlet opening of the gas inlet. The dead volume of the gas inlet may for example be in the range of 1 cm³ or less. Typically, micro-valves may be used to realize a small dead volume. Herein, a dead volume may be defined as a part of a passage, where a portion could retain materials or gases to contaminate subsequent flow media. During switching the previous gas may contaminate the subsequent gas.

According to other embodiments referred to with respect to FIG. 4a, a gas outlet 320 can also be provided. The gas outlet 320 may be connected to a vacuum system including a vacuum pump or a vacuum recipient. As described above, an evacuation of the enclosure 14 can be used to control the pressure in the enclosure. The evacuation of the enclosure 14 can also be used to evacuate the enclosure during a switching between a first operational mode and a further (second or third) operational mode. Thus, a gas used for the first operational mode can be removed faster from the area of ion generation.

Figure 4B:
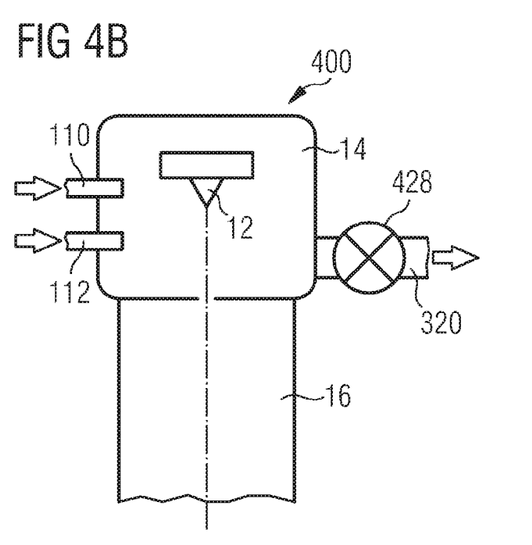
FIG. 4*b* shows a schematic view of parts of a charged particle beam device in the form of a focused ion beam device with gas inlets and valves according to embodiments described herein.

Within FIG. 4b, the charged particle beam device includes an emitter 12, an enclosure/gun chamber 14, and an ion beam column 16. Ions of gases, which are present in the enclosure 14, are generated by the high electric field of the biased emitter 12. The gases can be introduced in the enclosure according to any of the embodiments described herein.

According to another embodiment, as, for example, described with respect to FIG. 4b, a valve 428 is provided within the gas outlet 320. The valve 428 within the gas outlet may be closed in order to provide a low pressure on the side of the valve opposing the enclosure 14. Thereby, it is possible during a switching between the first operational mode and a further operational mode to open the valve and use the low-pressure on the opposing side for a faster removing of the gas in the enclosure, which has to be removed for switching between the operational modes.

Figure 5:
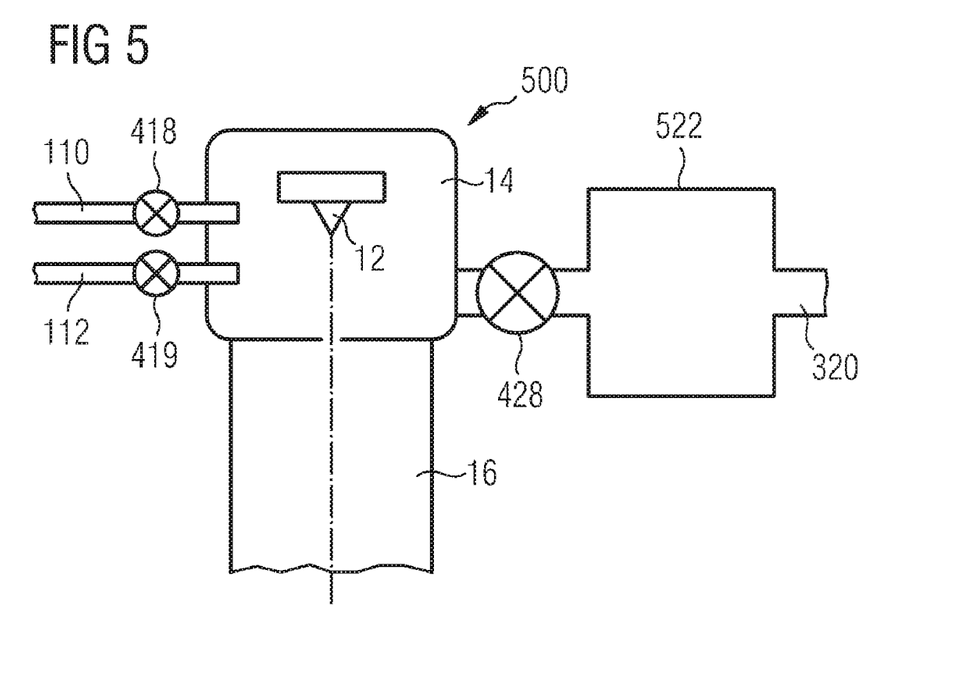
FIG. 5 shows a schematic view of parts of a charged particle beam device in the form of a focused ion beam device with gas inlets, valves and a vacuum recipient according to embodiments described herein.

This aspect may, according to an even further embodiment, the combined with a vacuum recipient 522 as shown in the focused ion beam device 500 of FIG. 5. Within FIG. 5, a charged particle beam device 500 is shown. The charged particle beam device includes an emitter 12, an enclosure/gun chamber 14, and an ion beam column 16. Ions of gases, which are present in the enclosure 14, are generated by the high electric field of the biased emitter 12. Additionally, valve 418 is provided within the first gas inlet 110. Further, valve 419 is provided within the second gas inlet 112. The valves are controlled by a controller adapted for switching between introducing the first gas in the enclosure 14 and the second gas in the enclosure. When one of the valves is closed the volume, in which the gas of the previous operational mode is still present and which needs to be removed for switching to another operational mode, is minimized if the valve is positioned close to the outlet opening of the gas inlet.

Within FIG. 5, the conduit of the gas outlet 320 is connected to a vacuum pump. The vacuum pump evacuates the vacuum recipient 522. Thus, an enlarged volume with low pressure is provided. During opening of valve 428, the volume of the enclosure 14 can be evacuated faster as a consequence of the additional volume of recipient 522. The shorter time for evacuation of the enclosure allows for a faster switching between the two operational modes.

Figure 6:
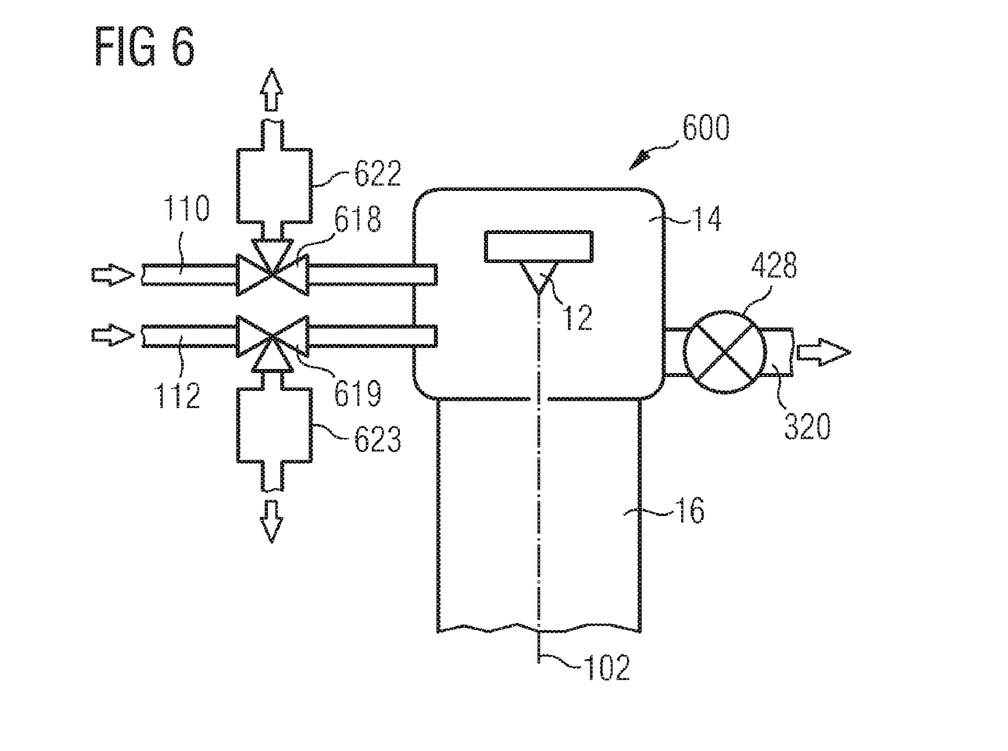
FIG. 6 shows a schematic view of parts of a charged particle beam device in the form of a focused ion beam device with gas inlets, valves and vacuum recipients according to embodiments described herein.

FIG. 6 shows the focused ion beam device 600. The charged particle beam device 600 includes an emitter 12, an enclosure/gun chamber 14, and an ion beam column 16. Ions of gases, which are present in the enclosure 14, are generated by the high electric field of the biased emitter 12.

According to one embodiment, a first gas inlet 110 with a conduit and a second gas inlet 112 with a conduit are provided. Additionally, valve 618 is provided within the first gas inlet 110. Further, valve 619 is provided within the second gas inlet 112. The valves are controlled by a controller adapted for switching between introducing the first gas in the enclosure 14 and the second gas in the enclosure. According to one embodiment, valves 618 and 619 are positioned close to the outlet opening of the gas inlets. Thereby, the amount of gas remaining from a previous operational mode, which has to be removed for a second or third operational mode, is reduced.

Within FIG. 6, valves 618 and 619 are 2-way valves. The further connections of the valves are connected to vacuum recipients 622 and 623, respectively. The vacuum recipients 622 and 623 are evacuated by a vacuum pump or the like. Thereby, an improved switching behavior between a first mode of operation and a further mode of operation may be provided. When for example valve 618 is closed, on the one hand, the supply of the first gas, which has been introduced by the first gas inlet 110, is stopped. On the other hand, the vacuum recipient 622 is connected to the outlet opening portion of the gas inlet. Thereby, the gas remaining in the outlet opening portion of the gas inlet is removed therefrom and the enclosure 14 is evacuated. Currently or thereafter, the valve 619 within the second gas inlet 112 is opened, such that the gas introduced through the second gas inlet can be supplied in the enclosure 14.

According to another embodiment, valves 618 and 619 may be connected with respective conduits to a common vacuum recipient.

According to one embodiment, as shown in FIG. 6, a further gas outlet 320 including valve 428 is provided. The valve 428 within the gas outlet may be closed in order to provide a low pressure on the side of the valve opposing the enclosure 14. Thereby, it is possible during a switching between the first operational mode and a further operational mode to open the valve and use the low-pressure for a faster removing of the gas in the enclosure, which has to be removed for switching between the operational modes.

According to another embodiment, the gas outlet 320 may be omitted. The enclosure 14 may then be evacuated through one of the valves 618 and 619, respectively. Thereby, when one of the valves is in a position to introduce a gas in the area of the emitter 12, the other valve is in a position to evacuate the enclosure 14 via the vacuum recipient connected to the corresponding valve. Generally, by using a 2-way valve, in order to shut off the gas flow, the connection between the gas and the emitter chamber, that is the enclosure, is closed and the connection between the emitter chamber and the vacuum recipient or vacuum pump is opened. This results in an immediate drop of the gas pressure in the emitter.

Figure 7:
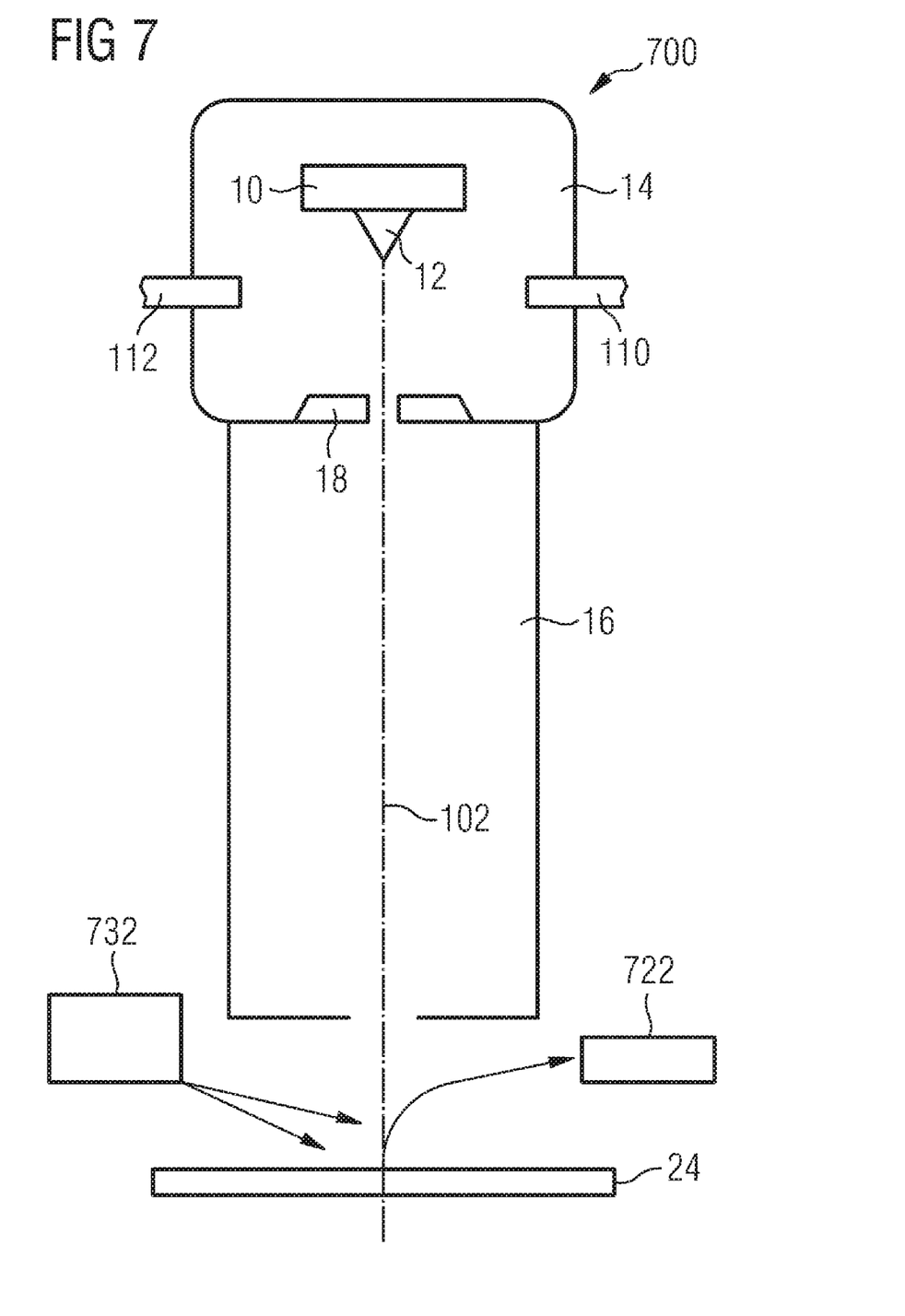
FIG. 7 shows a schematic view of parts of a charged particle beam device in the form of a focused ion beam device with gas inlets and means for conducting SIMS measurements according to embodiments described herein.

An even further mode of operation and further embodiments are described with respect to FIG. 7. The focused ion beam device 700 shown in FIG. 7 includes an emitter 12, an enclosure/gun chamber 14, and an ion beam column 16. Ions of gases, which are present in the enclosure 14, are generated by the high electric field of the biased emitter 12. A first gas inlet 110 and a second gas inlet 112 are provided. According to one operational mode, a light ion generating gas, such as hydrogen or helium is introduced into the chamber/enclosure 14 through the first gas inlet 110 and an ion beam of the ionized light gas is generate. The light gas ions can be used for an observation or imaging without damaging the specimen. According to a second operational mode, a heavy ion beam generating gas is introduced for a sputtering mode. Further, a mode with an etching gas, e.g., hydrogen for some materials, and/or a mode with a conditioning gas, e.g., oxygen for some conditioning applications, can be provided.

In addition to the modes of operation, which have been described above, the heavy gas ion beam can be used for material analysis. Thereby, a detector 722 suitable for secondary ion mass spectrometry SIMS is provided. The detector 722 detects and analyzes the ions of specimen 24, which are created by sputtering. On sputtering, the specimen emits particles, some of which are themselves ions. These secondary ions are measured with a mass spectrometer to determine the quantitative elemental or isotopic composition of the surface.

According to one embodiment, the sputtering is realized by the ion beam emitted by emitter 12. According to another embodiment, as shown in FIG. 7, an additional flood electron source 732 may be provided. Thereby the number of ionized secondary particles, which are released from the specimen 24 on impingement of the ion beam from emitter 12, can be increased. The increased amount of ionized secondary particles improves the detection sensitivity of detector 722.

Figure 8:
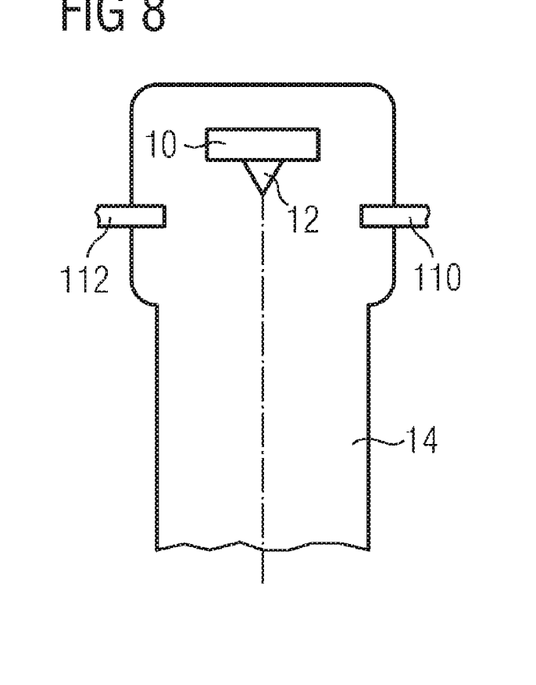
FIG. 8 shows a schematic view of parts of a charged particle beam device in the form of a focused ion beam device with gas inlets and an enclosure provided by the ion beam column according to embodiments described herein.

A further embodiment of an ion beam device is shown in FIG. 8. Within FIG. 8, the emitter 12 is provided in a chamber or column, see reference numeral 14. The first gas inlet 110 and a second gas inlet 112 of provided are introduce a light gas and a heavy gas and to, thereby, allow for two operational modes in a single column. As compared to the above-described embodiments, the different gases are provided directly into the column or chamber and no separate enclosure is provided.

Figure 9:
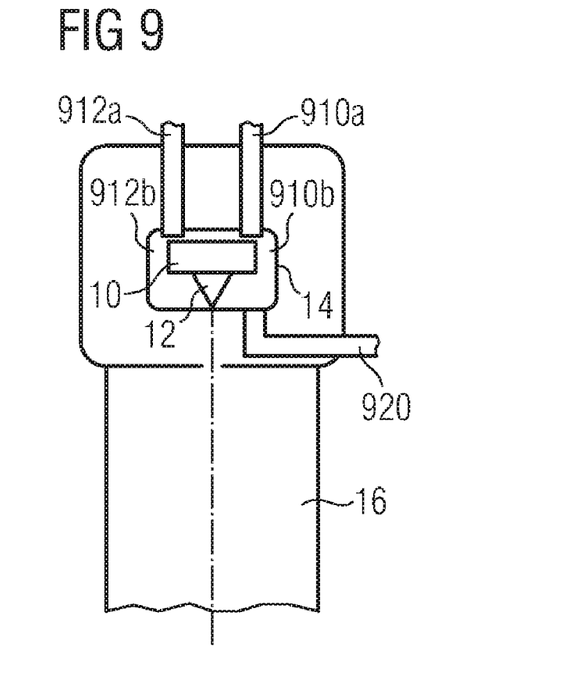
FIG. 9 shows a schematic view of parts of a charged particle beam device in the form of a focused ion beam device with gas inlets and a smaller enclosure within a gun chamber of an ion beam column according to embodiments described herein.

According to different embodiment, as shown in FIG. 9, the enclosure 14 may also be reduced in volume to reduce the amount of introduced gas. The desired partial pressure in the area of the emitter may be provided with a smaller amount of gas if the enclosure is reduced in size. Further, an evacuation or purging for the switching can be conducted faster.

Within FIG. 9, the emitter holder 10 and the emitter 12 are provided in an enclosure 14. The first gas inlet includes the first gas inlet tube 910a and a channel 910b between the emitter holder 10 and the wall of enclosure 14. A similar channel 910b may also be provided between other parts included for holding components, providing bias voltages, or other structural parts within the device. The second gas inlet includes the second gas inlet tube 912a and a gas inlet channel 912b. Within FIG. 9, the two channels 910b and 912b are separated from each other. According to other embodiments, the channels might have at least partially a common path.

Within FIG. 9, a gas outlet 920 is provided. As described above, the gas outlet can be used to control the pressure in the enclosure 14 and/or to evacuate the enclosure for switching between different operational modes.

The gas outlet 920 can be connected to a vacuum pump, a further vacuum chamber, or other means to support the evacuation of one of the two gases, that is a light gas and a heavy gas, in order to switch between the at least two operational modes. The gas outlet 920 and a vacuum system connected therewith may also be used to control the vacuum conditions within the enclosure 14. Thereby, the process parameter for ion generation can be controlled.

As described above, a single column charged particle beam device in the form of a focused ion beam device. Can be provided which allows for a high resolution imaging and sample modification. Thereby, in light of the fact that only one column is used, a reduction of costs can be achieved. Further, an automatic alignment between the point of incidence of the observation beam and the mortification beam can be realized more easily.

While the foregoing is directed to embodiments of the invention, other and further embodiments of the invention may be devised without departing from the basic scope thereof, and the scope thereof is determined by the claims that follow.

The invention claimed is:

1. Focused ion beam device, comprising:
    an ion beam column including an enclosure for housing a gas field ion source emitter with an emitter area for generating ions;
    a first gas inlet adapted to introduce a first gas to the emitter area;
    a second gas inlet adapted to introduce a second gas different from the first gas to the emitter area;
    an objective lens for focusing an ion beam generated from the first gas or the second gas; and
    a switching unit adapted to switch between introducing the first gas and introducing the second gas.

2. Focused ion beam device according to claim 1, further comprising:
    a gas outlet connected to a vacuum system adapted to evacuate the enclosure during switching between introducing the first gas and introducing the second gas.

3. Focused ion beam device according to claim 1, further comprising:
    a first valve provided within the first gas inlet; and
    a second valve provided within the second gas inlet, wherein the first valve and the second valve are controlled by the switching unit.

4. Focused ion beam device according to claim 3, wherein the first valve has a first gas supply conduit to a gas supply for the first gas, a first gas inlet conduit for introducing the first gas in a chamber and a first evacuation conduit for connection to at least one vacuum recipient, and wherein the second valve has a second gas supply conduit to a gas supply for the second gas, a second gas inlet conduit for introducing the second gas in the chamber and a second evacuation conduit for connection to the at least one vacuum recipient.

5. Focused ion beam device according to claim 1, wherein the first gas inlet has a first gas inlet tube and a first gas inlet channel and the second gas inlet has a second gas inlet tube and a second gas inlet channel.

6. Focused ion beam device according to claim 2, wherein the vacuum system includes a vacuum recipient.

7. Focused ion beam device according to claim 1, further comprising:
    a scan deflector provided in the ion beam column and adapted for raster scanning an ion beam over a specimen;
    a detector provided in the ion beam column and adapted for time resolved detection of corpuscles released from the specimen upon impingement of the ion beam; and
    a controller connected to the scan deflector and the detector.

8. Focused ion beam device according to claim 7, wherein the time resolved detection is adapted for a time resolution of 2 µs or below 2 µs.

9. Focused ion beam device according to claim 1, wherein the enclosure is provided in a gun chamber of the ion beam column.

10. Focused ion beam device according to claim 1, wherein the enclosure has a volume of 5 cm$^3$ or less.

11. Focused ion beam device according to claim 1, further comprising:
    a mass spectrometer for identification of ions or ionized particles released from a specimen.

12. Focused ion beam device according to claim 11, further comprising:
a flood electron gun provided in an area adjacent to a specimen area.

13. Focused ion beam device according to claim 1, further comprising:
at least a third gas inlet for introducing at least a third gas into the enclosure.

14. Focused ion beam device according to claim 13, further comprising:
at least a third valve provided within the at least third gas inlet being controlled by the switching unit.

15. Focused ion beam device according to claim 14, wherein the at least third gas inlet has at least a third gas inlet tube and at least third a third gas inlet channel.

16. Focused ion beam device according to claim 1, wherein the first gas is a light gas selected from the group consisting of hydrogen and helium, wherein the second gas is a heavy gas selected from the group consisting of argon, neon, krypton, and combinations thereof.

17. Focused ion beam device, comprising:
an ion beam column including an enclosure for housing an emitter with an emitter area for generating ions of a light gas and a heavy gas;
means for switching between introducing the light gas into the emitter area for an observation mode and introducing the heavy gas into the emitter area for a modification mode, wherein the light gas is selected from the group consisting of hydrogen and helium and the heavy gas has an atomic mass of 10 g/mol or higher.

18. Focused ion beam device according to claim 17, wherein the heavy gas is selected from the group consisting of argon, neon, krypton, and combinations thereof.

19. Method of operating a focused ion beam device, comprising:
biasing an emitter within an emitter area wherein ions are generated;
switching between introducing a light ion beam generating gas into the emitter area and a heavy ion beam generating gas into the emitter area, wherein the light gas is selected from the group consisting of hydrogen and helium and the heavy gas has an atomic mass of 10 g/mol or higher.

20. Method of operating a focused ion beam device according to claim 19, further comprising:
evacuating an enclosure surrounding the emitter area.

21. Method of operating a focused ion beam device according to claim 19, wherein the switching includes controlling a first valve provided within a first gas inlet and a second valve provided within a second gas inlet.

22. Method of operating a focused ion beam device according to claim 19, further comprising:
scanning an ion beam generated from the light ion beam generating gas over a specimen for an observation mode;
detecting corpuscles released from the specimen upon impingement of the ion beam from the light ion beam generating gas for observation of the specimen; and
modifying the specimen during a modification mode, during a time the heavy ion beam generating gas is introduced in the emitter area.

23. Method of operating a focused ion beam device according to claim 22, wherein the modifying includes at least a step selected from the group consisting of sputtering and etching.

24. Method of operating a focused ion beam device according to claim 19, further comprising:
mass detecting of ionized particles released from a specimen during a time the heavy ion beam generating gas is introduced in the emitter area.

25. Method of operating a focused ion beam device according to claim 24, further comprising:
ionizing particles released from the specimen during a time the heavy ion beam generating gas is introduced in the emitter area.

26. Method of operating a focused ion beam device according to claim 19, wherein the heavy ion beam generating gas is selected from the group consisting of argon, neon, krypton, and combinations thereof.

27. Method of operating a focused ion beam device according to claim 19, further comprising:
introducing a processing gas in the emitter area.

28. Method of operating a focused ion beam device according claim 27, wherein the processing gas is oxygen.

29. Method of operating a focused ion beam device according to claim 19, further comprising:
introducing a further heavy ion beam generating gas into the emitter area, wherein the further ion beam generating heavy gas has an atomic mass of 10 g/mol or higher.

30. Method of operating a focused ion beam device according to claim 19, further comprising:
introducing a hydrogen into the emitter area for an etching operation mode.

* * * * *